(12) United States Patent
Wang

(10) Patent No.: US 10,825,735 B2
(45) Date of Patent: Nov. 3, 2020

(54) SEMICONDUCTOR STRUCTURE AND FABRICATION METHOD THEREOF

(71) Applicants: Semiconductor Manufacturing International (Shanghai) Corporation, Shanghai (CN); SMIC New Technology Research and Development (Shanghai) Corporation, Shanghai (CN)

(72) Inventor: Qing Peng Wang, Shanghai (CN)

(73) Assignees: Semiconductor Manufacturing International (Shanghai) Corporation, Shanghai (CN); SMIC New Technology Research and Development (Shanghai) Corporation, Shanghai (CN)

(*) Notice: Subject to any disclaimer, the term of this patent is extended or adjusted under 35 U.S.C. 154(b) by 0 days.

(21) Appl. No.: 16/117,634

(22) Filed: Aug. 30, 2018

(65) Prior Publication Data
US 2019/0103318 A1 Apr. 4, 2019

(30) Foreign Application Priority Data
Sep. 30, 2017 (CN) .......................... 2017 1 0927079

(51) Int. Cl.
| | | |
|---|---|---|
| *H01L 21/8234* | (2006.01) | |
| *H01L 29/66* | (2006.01) | |
| *H01L 21/308* | (2006.01) | |
| *H01L 21/027* | (2006.01) | |
| *H01L 27/02* | (2006.01) | |
| *H01L 21/762* | (2006.01) | |

(Continued)

(52) U.S. Cl.
CPC .. *H01L 21/823431* (2013.01); *H01L 21/0217* (2013.01); *H01L 21/0276* (2013.01); *H01L 21/02164* (2013.01); *H01L 21/02205* (2013.01); *H01L 21/02236* (2013.01); *H01L 21/02271* (2013.01); *H01L 21/02318* (2013.01); *H01L 21/3086* (2013.01); *H01L 21/30604* (2013.01); *H01L 21/76224* (2013.01); *H01L 21/823481* (2013.01); *H01L 27/0207* (2013.01); *H01L 27/0886* (2013.01); *H01L 29/6681* (2013.01); *H01L 21/02211* (2013.01); *H01L 21/76229* (2013.01)

(58) Field of Classification Search
CPC ......... H01L 21/823431; H01L 27/0886; H01L 29/6681; H01L 29/66795
See application file for complete search history.

(56) References Cited

U.S. PATENT DOCUMENTS 9,147,029 B2 * 9/2015 Ke ...................... G06F 17/5072
9,564,446 B1 * 2/2017 Weybright ...... H01L 21/823431
(Continued)

*Primary Examiner* — Bac H Au
(74) *Attorney, Agent, or Firm* — Anova Law Group, PLLC

(57) ABSTRACT

A semiconductor structure and a method for fabricating the semiconductor structure are provided. The method includes providing a substrate. The substrate includes an active region and a blank region disposed adjacent to the active region. The method also includes forming a fin material layer on the substrate. Further, the method includes forming a plurality of fins on the active region, and a plurality of dummy fins on the blank region by etching the fin material layer. A spacing between a fin and an adjacent dummy fin is greater than a spacing between adjacent fins.

17 Claims, 10 Drawing Sheets

(51) Int. Cl.
*H01L 21/02* (2006.01)
*H01L 27/088* (2006.01)
*H01L 21/306* (2006.01)

(56) References Cited

U.S. PATENT DOCUMENTS

| | | | |
|---|---|---|---|
| 9,799,570 B1* | 10/2017 | Cheng | H01L 21/823878 |
| 9,805,984 B2* | 10/2017 | Yin | H01L 21/823821 |
| 9,853,131 B1* | 12/2017 | Cheng | H01L 21/823418 |
| 10,204,794 B2* | 2/2019 | Ambati | H01L 29/66795 |
| 10,403,742 B2* | 9/2019 | Zhao | H01L 21/823431 |
| 2013/0277760 A1* | 10/2013 | Lu | H01L 29/10 |
| | | | 257/401 |
| 2017/0263454 A1 | 9/2017 | Li et al. | |
| 2017/0278947 A1* | 9/2017 | Feng | H01L 21/823431 |
| 2018/0004882 A1* | 1/2018 | Hsieh | H01L 29/6681 |
| 2018/0069003 A1* | 3/2018 | Cheng | H01L 27/0922 |
| 2018/0175046 A1* | 6/2018 | Chiou | H01L 27/1104 |
| 2019/0189457 A1* | 6/2019 | Lie | H01L 21/3081 |

\* cited by examiner

US 10,825,735 B2

SEMICONDUCTOR STRUCTURE AND FABRICATION METHOD THEREOF

CROSS-REFERENCES TO RELATED APPLICATIONS

This application claims the priority of Chinese patent application No. 201710927079.6, filed on Sep. 30, 2017, the entirety of which is incorporated herein by reference.

FIELD OF THE DISCLOSURE

The present disclosure generally relates to the field of semiconductor manufacturing and, more particularly, relates to a semiconductor structure and fabrication method thereof.

BACKGROUND

To further reduce the size of the metal-oxide-semiconductor (MOS) devices, a multifaceted-gate field effect transistor (FET) structure has been developed to improve control capability of the gate of the MOS devices, and to suppress a short-channel effect. Among them, a fin field effect transistor (FinFET) is one of common multifaceted-gate field effect transistors.

The FinFET has a three-dimensional structure. The FinFET includes a substrate, one or more protruding fins formed on the substrate, and an insulating isolation structure disposed between adjacent fins. The FinFET also includes a gate electrode across the one or more fins and covering top and sidewall surfaces of each of the fins. Because the three-dimensional FinFET is significantly different from a conventional planar transistor, improper operations in some manufacturing processes may cause a great impact on the electrical properties of the formed device.

In a FinFET, the source region, drain region, and channel may all be formed in the fin of the FinFET. Thus, the formation quality of the fin has an important influence on the performance of the semiconductor structure. When the fins are partially formed in a region of the substrate, to improve the loading effect in the etching process and to improve uniformity of the formed fins, the fins are usually formed by a fin cut last process.

However, by using the fin cut last process, the process window for forming the semiconductor structure is substantially small and the process difficulty is substantially high, therefore the performance and yield of the formed semiconductor structure are affected. The disclosed methods and device structures are directed to solve one or more problems set forth above and other problems in the art.

BRIEF SUMMARY OF THE DISCLOSURE

One aspect of the present disclosure includes a method for fabricating a semiconductor structure. The method includes providing a substrate. The substrate includes an active region and a blank region disposed adjacent to the active region. The method also includes forming a fin material layer on the substrate. Further, the method includes forming a plurality of fins on the active region, and a plurality of dummy fins on the blank region by etching the fin material layer. A spacing between a fin and an adjacent dummy fin is greater than a spacing between adjacent fins.

Another aspect of the present disclosure includes a semiconductor structure. The semiconductor structure includes a substrate. The substrate includes an active region and a blank region disposed adjacent to the active region. The semiconductor structure also includes a plurality of fins on the active region of the substrate. Further, the semiconductor structure includes a plurality of dummy fins on the blank region of the substrate. A spacing between a fin and an adjacent dummy fin is greater than a spacing between adjacent fins.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
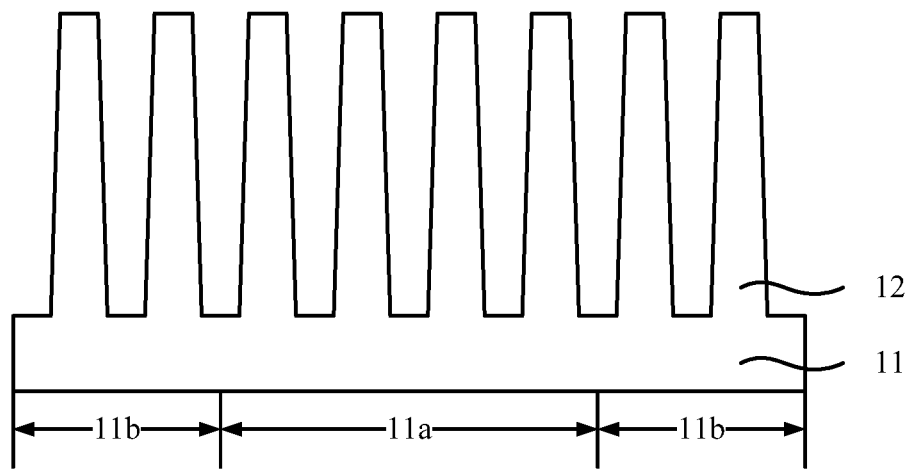
FIGS. 1-3 illustrate semiconductor structures corresponding to certain stages for forming a semiconductor structure.
Figure 2:
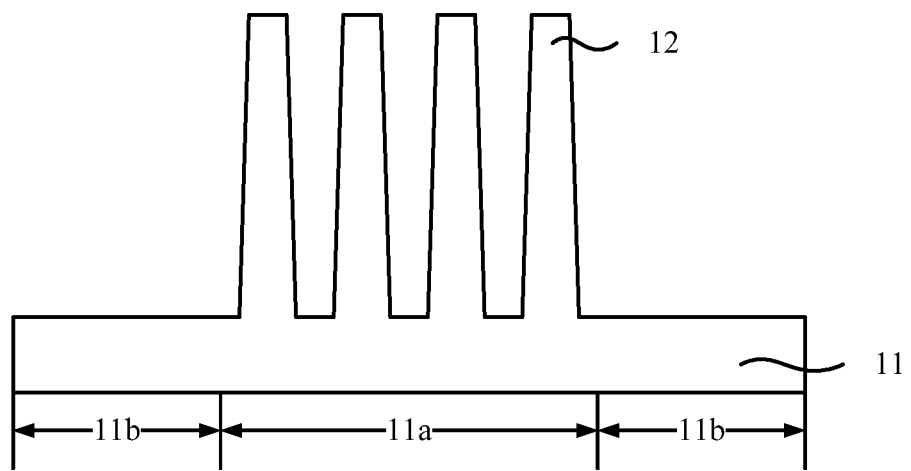
Figure 3:
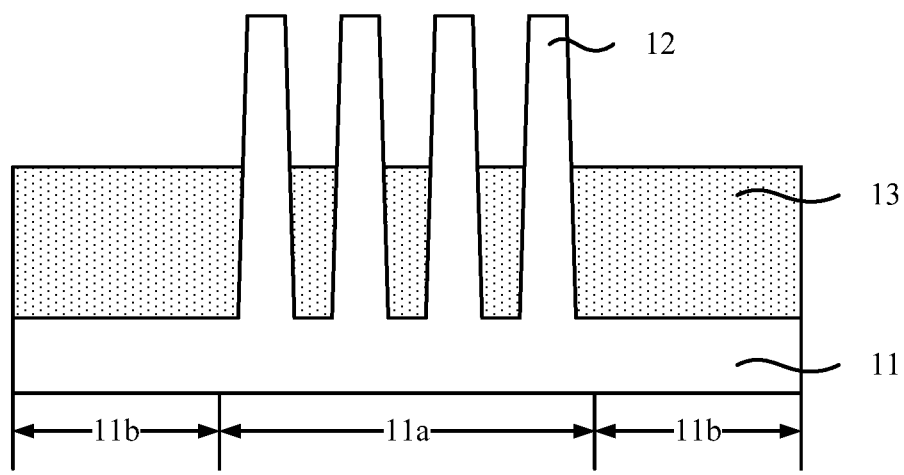

FIGS. 1-3 illustrate semiconductor structures corresponding to certain stages for forming a semiconductor structure. Referring to FIG. 1, a substrate 11 is provided. The substrate 11 includes an active region 11a and a blank region 11b. The active region 11a and the blank region 11b are disposed adjacent to each other. One or more fins 12 are formed on the substrate 11, and the fins 12 are formed on both the active region 11a and the blank region 11b.

Referring to FIG. 2, the fins 12 on the blank region 11b are removed to expose the blank region 11b of the substrate 11. The fins 12 on the active region 11a are retained.

Referring to FIG. 3, an isolation layer 13 is formed on the substrate 11 exposed by the remaining fins 12. A top of the isolation layer 13 is lower than a top of the fin 12 to expose a portion of sidewalls of the fin 12.

Because the semiconductor structure is formed by a fin cut last process, the fins 12 are first formed on both the active region 11a and the blank region 11b, and then, the fins 12 on the blank region 11b are removed and the fins 12 on the active region 11a are retained, thereby providing a platform for subsequent processes.

Figure 4:
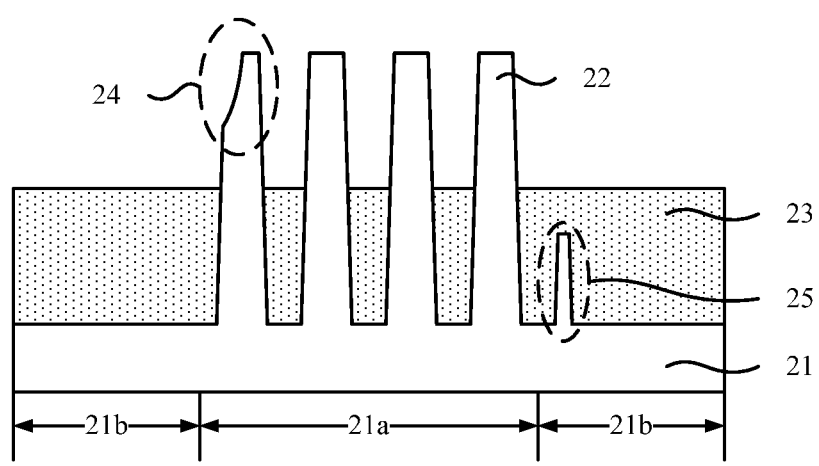

As the size of the device decreases, a spacing between adjacent fins 12 decreases. The decrease of the spacing between the adjacent fins 12 causes the process window for removing the fins 12 on the blank region 11b to be too small. Referring to FIG. 4, when removing the fins 12 on the blank region 11b, if the overlay accuracy is insufficient, the remaining fins 12 on the active region 11a will be damaged (e.g., a structure shown in a circle 24 in FIG. 4), and residue of the fins 12 on the blank region 11b will be retained (e.g., a structure shown in a circle 25 in FIG. 4).

Moreover, as the spacing between the adjacent fins 12 decreases, the process difficulty for the formed isolation layer 13 to sufficiently fill a gap between the adjacent fins 12 increases. Therefore, the isolation layer 13 is usually formed by a fluid chemical vapor deposition process, which will oxidize the fin 12 closest to the blank region 11b, and cause an issue of uneven thickness of the fins 12 after forming the isolation layer 13.

Figure 5:
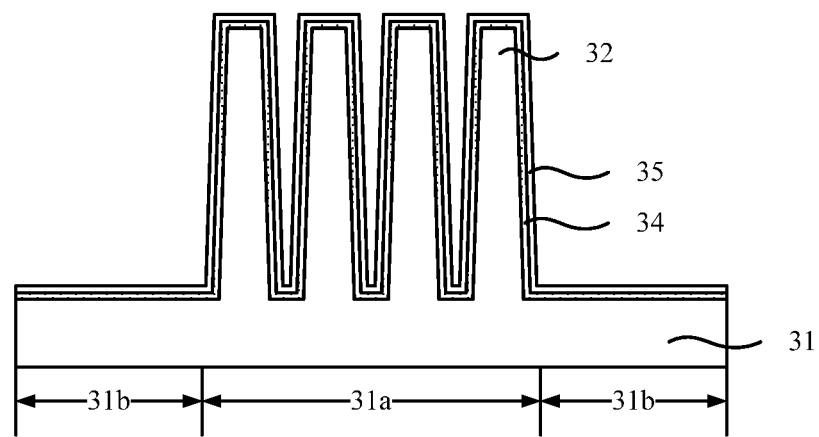
FIGS. 5-7 illustrate semiconductor structures corresponding to certain stages for forming another semiconductor structure.
Figure 6:
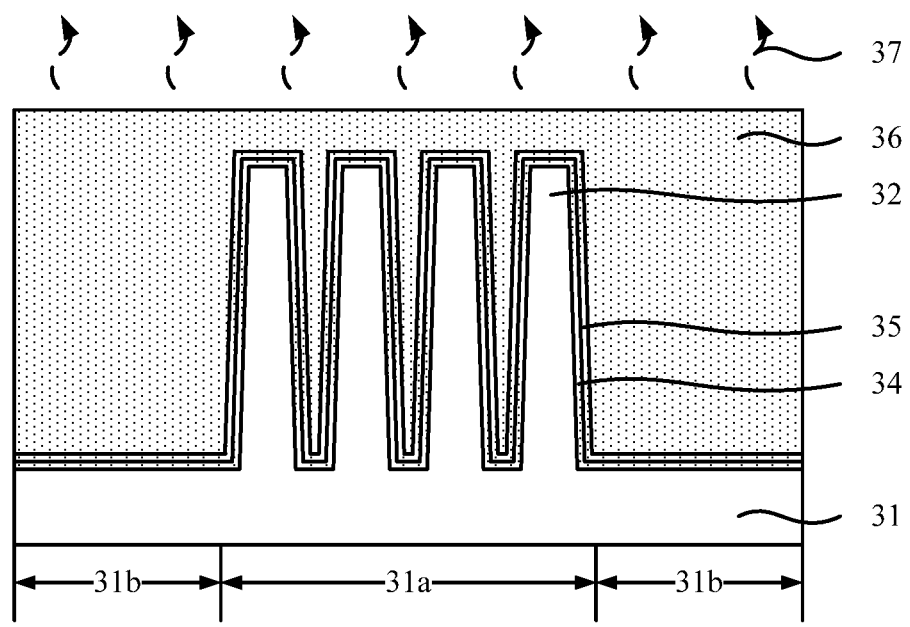
Figure 7:
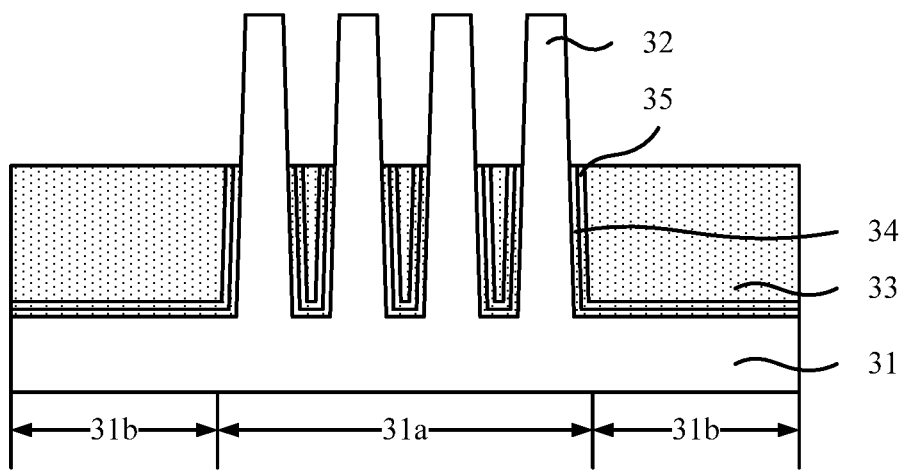

FIGS. 5-7 illustrate semiconductor structures corresponding to certain stages for forming another semiconductor structure. Referring to FIG. 5, after removing fins 32 on a blank region 31b, a linear oxide layer 34 is formed. The linear oxide layer 34 covers surfaces of the remaining fins 32 and a surface of a substrate 31. A silicon sacrificial layer 35 is formed on the linear oxide layer 34.

Referring to FIG. 6, after forming the silicon sacrificial layer 35, a flowable precursor layer 36 is formed by a fluid chemical vapor deposition process, and the precursor layer 36 is cured by an annealing treatment 37. Referring to FIG. 7, an isolation layer 33 is formed by removing a thickness portion of the cured precursor layer 36 (illustrated in FIG. 6).

The silicon sacrificial layer 35 can absorb oxygen element diffused from the precursor layer 36 during the annealing treatment 37, and improve the issue of non-uniformity of the fins 32 due to the oxidization. However, because the silicon sacrificial layer 35 is formed after removing the fins 32 on the blank region 31b, the silicon sacrificial layer 35 cannot influence the process of removing the fins 32 on the blank region 31b. That is, the process window for removing the fins 32 on the blank region 31b is still too small, and the issues of small process window and high process difficulty cannot be resolved.

The present disclosure provides a semiconductor structure and a method for forming the semiconductor structure. A spacing between a fin and an adjacent dummy fin may be greater than a spacing between adjacent fins, such that the process window may be expanded, the process difficulty may be reduced, and the manufacturing yield may be improved. Further, after forming an isolation layer, a width uniformity of the fins may be improved.

Figure 16:
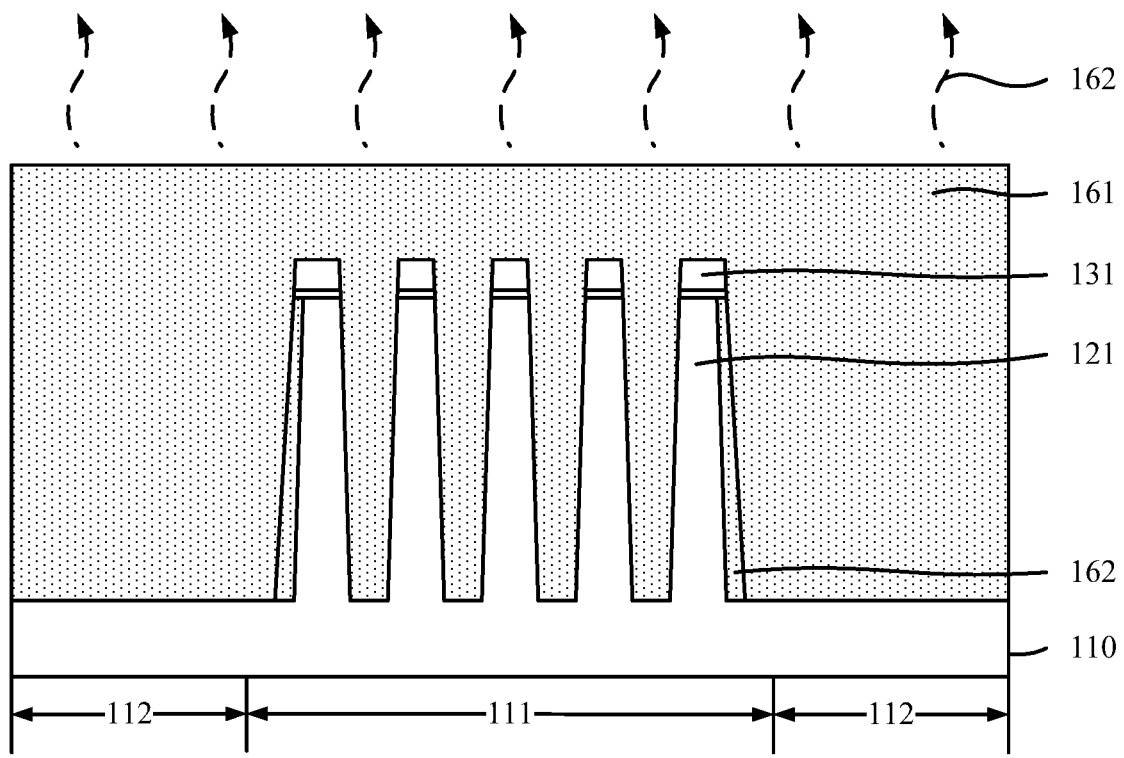
Figure 17:
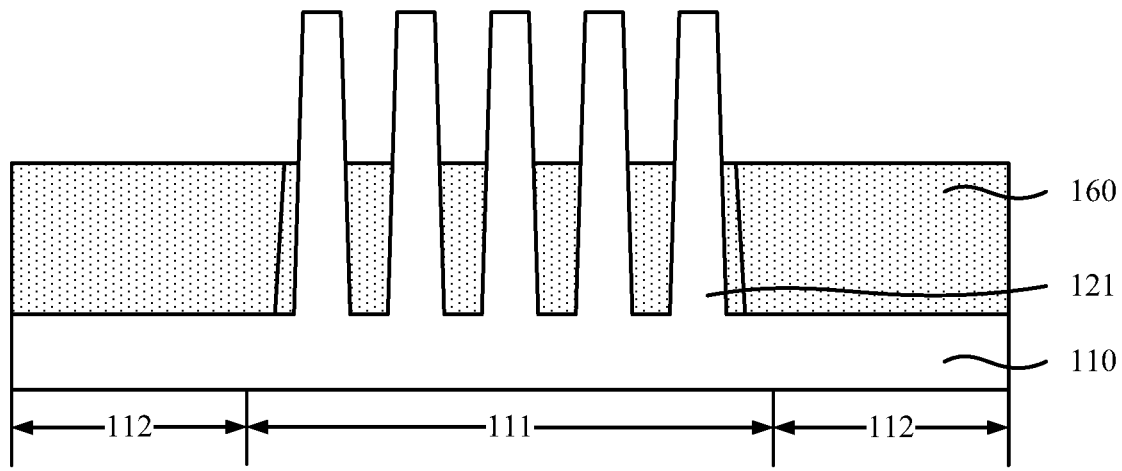
Figure 18:
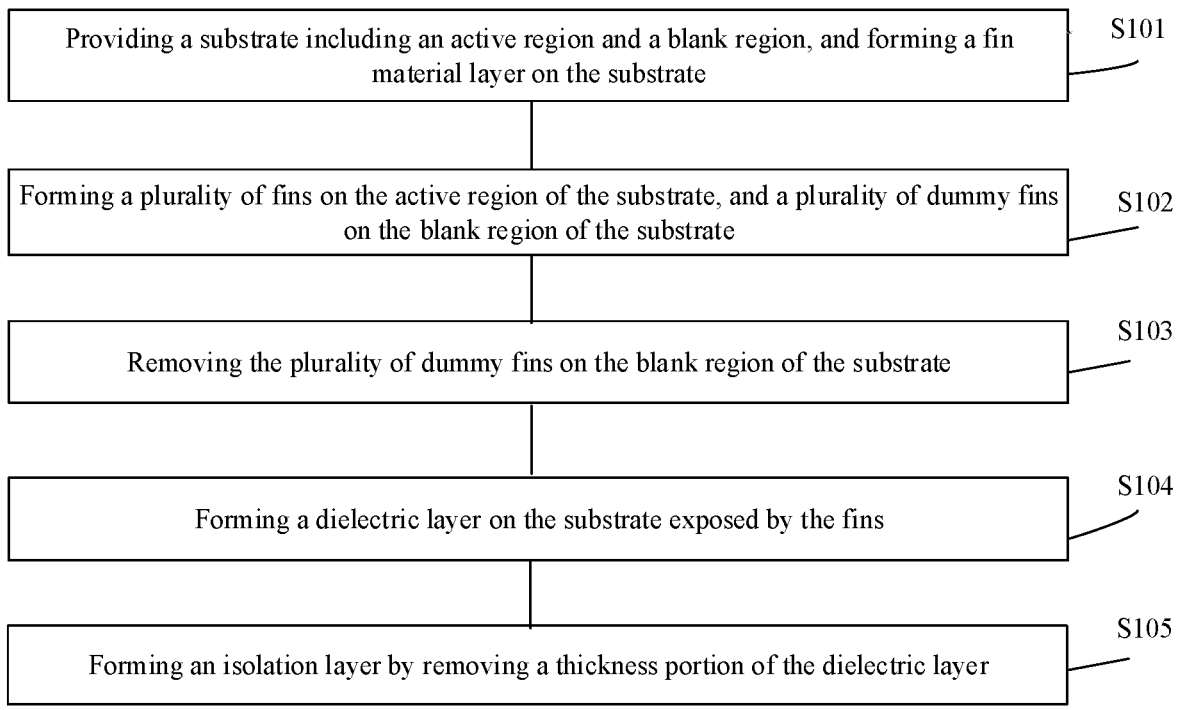
FIG. 18 illustrates an exemplary fabrication method for forming a semiconductor structure consistent with various disclosed embodiments of the present disclosure.

FIG. 18 illustrates an exemplary fabrication method for forming a semiconductor structure consistent with various disclosed embodiments of the present disclosure; and FIGS. 8-17 illustrate semiconductor structures corresponding to certain stages of the exemplary fabrication method.

Figure 8:
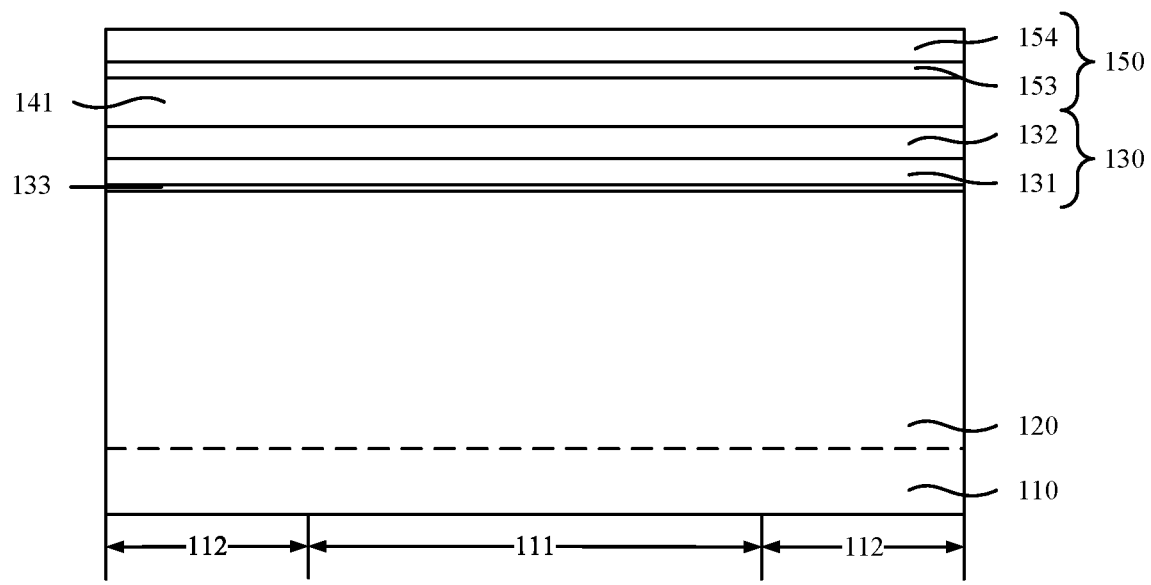
FIGS. 8-17 illustrate semiconductor structures corresponding to certain stages for forming an exemplary semiconductor structure consistent with various disclosed embodiments of the present disclosure.

As shown in FIG. 18, at the beginning of the fabrication method, a substrate with certain structures may be provided (S101). FIG. 8 illustrates a corresponding semiconductor structure.

Referring to FIG. 8, a substrate 110 may be provided. The substrate 110 may include an active region 111 and a blank region 112 disposed adjacent to the active region 111. The substrate 110 may provide a process operation platform for subsequent processes and may provide mechanical support in the semiconductor structure.

The active region 111 of the substrate 110 may be used to form a semiconductor structure having fin(s), and the blank region 112 of the substrate 110 may be used to form a planar semiconductor structure. In other words, the semiconductor structure formed from the blank region 112 may not have fin(s).

In one embodiment, the number of the blank regions 112 may be two, and the two blank regions 112 may be disposed on sides of the active region 111, respectively. In another embodiment, the substrate may include one blank region disposed adjacent to the active region. In certain embodiments, the substrate may include a plurality of active regions and a plurality of blank regions. The active regions and the blank regions may be alternatively arranged.

In embodiment, the substrate 110 may be made of monocrystalline silicon. In another embodiment, the substrate may be made of polysilicon, amorphous silicon, amorphous germanium, germanium, silicon germanium, silicon carbide, gallium arsenide, or indium gallium, etc. In certain embodiments, the substrate may be a silicon on insulator (SOI) substrate, a germanium on insulator (GOI) substrate, a glass substrate, and other types of substrates. The substrate may be made of materials adaptable to process requirements and easy for integration.

A fin material layer 120 may be formed on the substrate 110. The fin material layer 120 may be used to form fins after being etched. In one embodiment, the fin material layer 120 may be made of a same material as the substrate 110. The fin material layer 120 and the substrate 110 may be made of monocrystalline silicon. In another embodiment, the fin material layer may be made of a material different from the substrate. The fin material layer may be made of amorphous germanium, germanium, silicon germanium, silicon carbide, gallium arsenide, or indium gallium, etc.

In one embodiment, the fin material layer 120 may be an integral structure with the substrate 110. That is, there may be no clear boundary between the substrate 110 and the fin material layer 120. In another embodiment, the fin material layer and the substrate may have a clear boundary.

After providing the substrate 110, a hard mask layer 130 may be formed on the fin material layer 120. The disposition of the hard mask layer 130 may obtain a pattern closer to an original design in a subsequent etching process, and may protect tops of subsequently formed fins.

In one embodiment, the hard mask layer 130 may have a stacked-layer structure, including a nitride hard mask 131 and an oxide hard mask 132 on the nitride hard mask 131. For example, the nitride hard mask 131 may be made of silicon nitride, and the oxide hard mask 132 may be made of silicon oxide. The nitride hard mask 131 and the oxide hard mask 132 each may be formed by a chemical vapor deposition process, a physical vapor deposition process, or an atomic layer deposition process, etc.

In one embodiment, to improve the quality of the formed hard mask layer 130 and, more particularly, to improve the quality of the formed nitride hard mask 131, after providing the substrate 110 and before forming the hard mask layer 130, a pad oxide layer 133 may be formed on the fin material layer 120.

The pad oxide layer 133 may protect the fin material layer 120 to reduce the probability of the fin material layer 120 being damaged in a subsequent process, and may repair defects on a surface of the fin material layer 120 to provide a desired growth surface for the formation of the hard mask layer 130. Therefore, the performance of the formed semiconductor structure may be improved.

Returning to FIG. 18, after providing the substrate with certain structures, a plurality of fins and a plurality of dummy fins may be formed (S102). FIGS. 9-13 illustrate corresponding semiconductor structures.

Referring to FIGS. 9-13, by etching the fin material layer 120 (illustrated in FIG. 8), a plurality of fins 121 (illustrated in FIG. 13) may be formed on the active region 111 of the substrate 110, and a plurality of dummy fins 122 (illustrated in FIG. 13) may be formed on the blank region 112 of the substrate 110.

The fin 121 may be used to provide a channel for the formed semiconductor structure, and the dummy fin 122 may have to be subsequently removed to form a semiconductor structure without fin(s).

Figure 13:
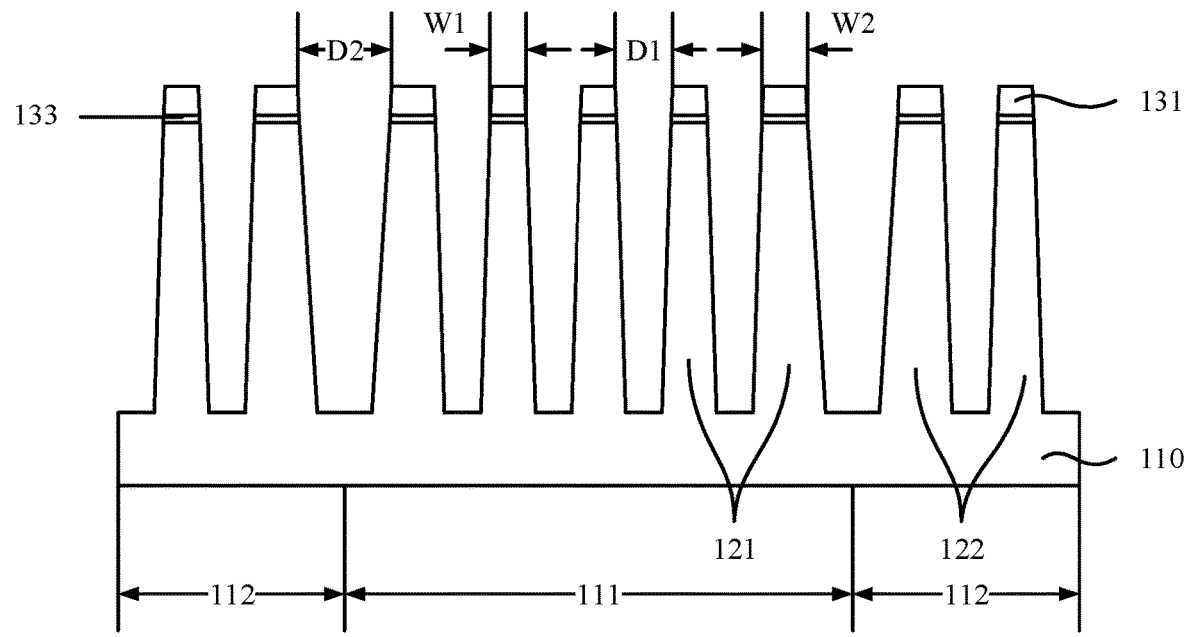

In one embodiment, a spacing 'D2' between a fin 121 and an adjacent dummy fin 122 (illustrated in FIG. 13) may be greater than a spacing 'D1' between adjacent fins 121 (illustrated in FIG. 13).

The spacing 'D2' between the fin 121 and the adjacent dummy fin 122 may be referred to a width of a gap between the fin 121 closet to the blank region 112 and the dummy fin 122 closet to the active region 111 along a direction perpendicular to a length direction of the fin 121 in a plane parallel to a surface of the substrate 110. The spacing 'D1' between the adjacent fins 121 may be referred to a width of a gap between the adjacent fins 121 along the direction perpendicular to the length direction of the fin 121 in the plane parallel to the surface of the substrate 110.

The substantially large spacing 'D2' between the fin 121 and the adjacent dummy fin 122 may effectively reduce the requirements of overlay accuracy during subsequent removal of the dummy fins 122, which may facilitate to expand the process window, to reduce the process difficulty, and to improve the manufacturing yield.

In addition, due to an etch loading effect, the substantially large spacing 'D2' between the fin 121 and the adjacent dummy fin 122 may enable a width 'W2' of the fin 121 closest to the blank region 112 to be greater than a width 'W1' of remaining fins 121. Therefore, an issue of reduced widths of the fins 121 caused by oxidation during a subsequent formation of an isolation layer may be counteracted to a certain extent, and the width uniformity of the fins 121 after forming the isolation layer may be effectively improved. In the disclosed embodiments, the process window may be expanded, and the uniformity of fins may be improved.

In one embodiment, a ratio (D2/D1) of the spacing 'D2' between the fin 121 and the adjacent dummy fin 122 over the spacing 'D1' between the adjacent fins 121 may be in a range of approximately 1-2.

The ratio (D2/D1) of the spacing 'D2' between the fin 121 and the adjacent dummy fin 122 over the spacing 'D1' between the adjacent fins 121 cannot be too large or too small. When the ratio (D2/D1) of the spacing 'D2' between the fin 121 and the adjacent dummy fin 122 over the spacing 'D1' between the adjacent fins 121 is too large, the spacing 'D2' between the fin 121 and the adjacent dummy fin 122 may be too large, and the spacing 'D1' between the adjacent fins 121 may be too small. Due to the etch loading effect, the fin 121 closest to the blank region 112 may have a too large width, which may affect the uniformity of the formed fins 121. When the ratio (D2/D1) of the spacing 'D2' between the fin 121 and the adjacent dummy fin 122 over the spacing 'D1' between the adjacent fins 121 is too small, the spacing 'D2' between the fin 121 and the adjacent dummy fin 122 may be too small, and the spacing 'D1' between the adjacent fins 121 may be too large. Thus, the requirements of the overlay accuracy may not be reduced, and the process window may not be expanded.

In one embodiment, the spacing 'D2' between the fin 121 and the adjacent dummy fin 122 may be in a range of approximately 25 nm-50 nm, and the spacing 'D1' between the adjacent fins 121 may be in a range of approximately 25 nm-30 nm. Configuring the spacing between the fin 121 and the adjacent dummy fin 122 within a suitable range may maintain a device density of the formed semiconductor structure to ensure the integration degree of the formed semiconductor structure; may effectively expand the process window and reduce the process difficulty to ensure the manufacturing yield for forming the semiconductor structure; and may enable the width of the fin 121 closest to the blank region 112 and the width of the dummy fin 122 closest to the active region 111 to be substantially larger than other fins and other dummy fins respectively to offset the width loss of the fin 121 in the subsequent process, which may facilitate to improve the width uniformity of the fins 121 in the formed semiconductor structure.

Figure 10:
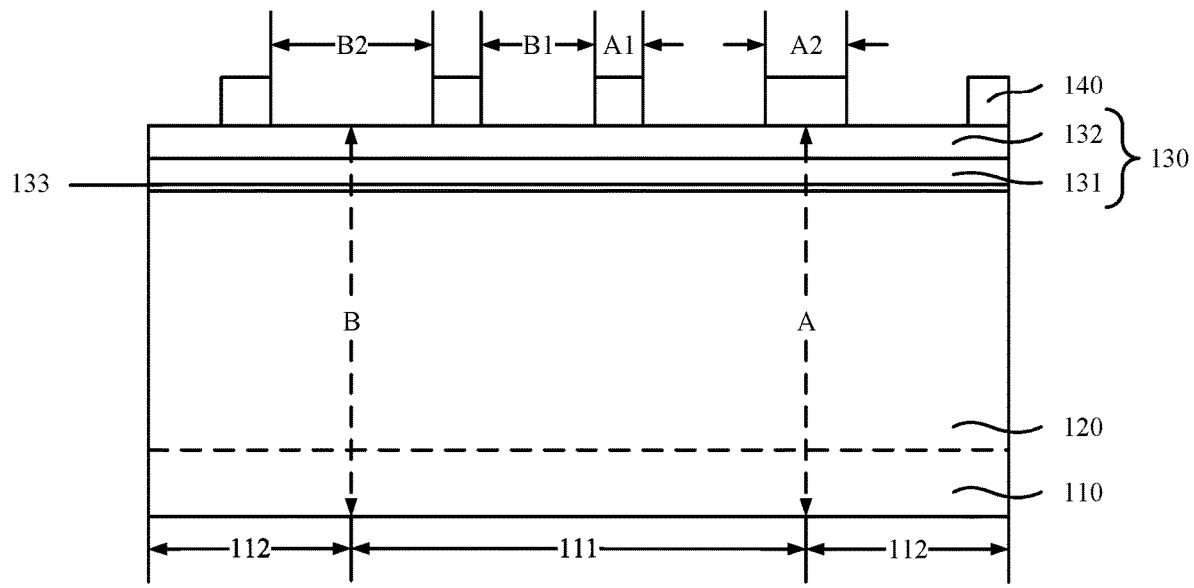
Figure 11:
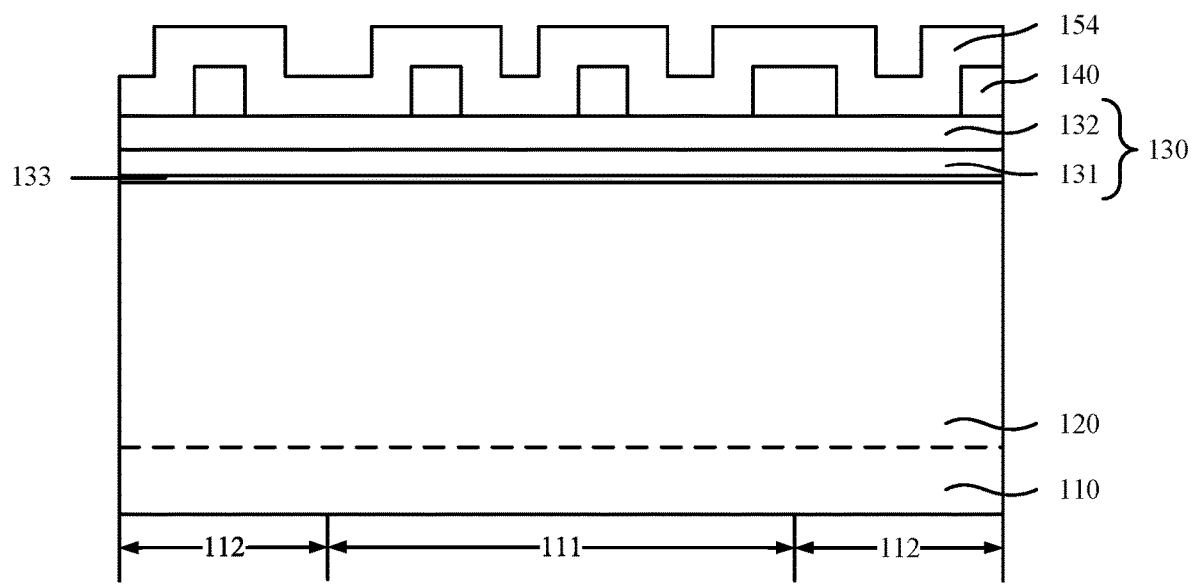
Figure 12:
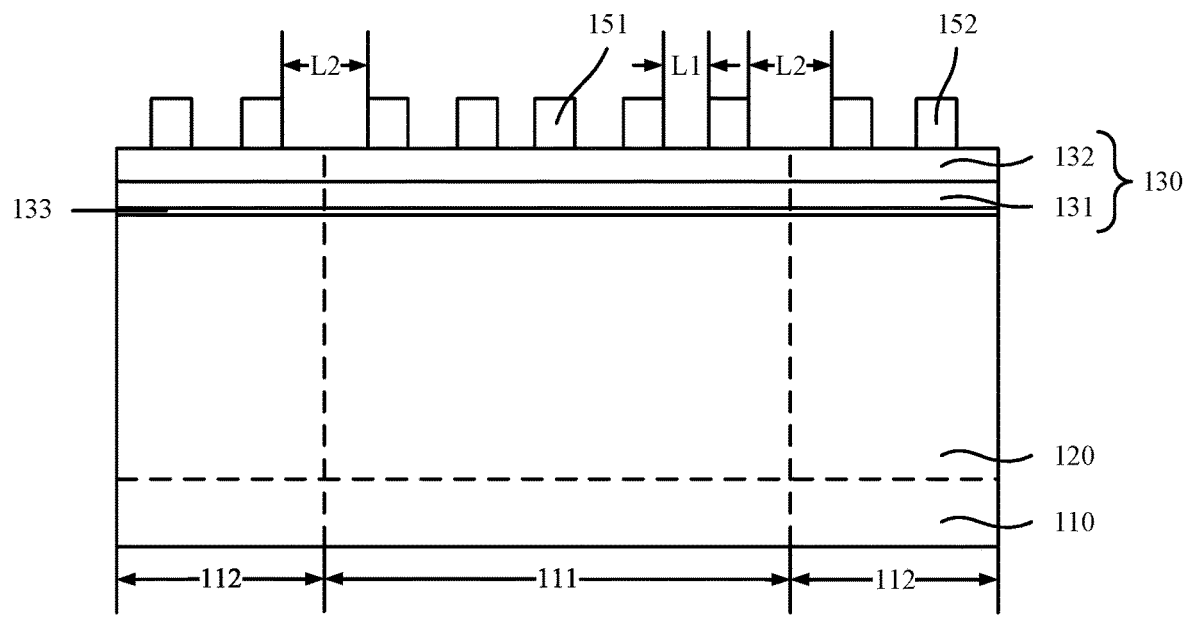

In one embodiment, forming the fins 121 and the dummy fins 122 may include the following. Referring to FIGS. 8-12, a plurality of fin patterns 151 (illustrated in FIG. 12) may be formed over the active region 111, and a plurality of dummy fin patterns 152 (illustrated in FIG. 12) may be formed over the blank region 112. A spacing 'L2' between a fin pattern 151 and an adjacent dummy fin pattern 152 may be greater than a spacing 'L1' between adjacent fin patterns 151. Referring to FIGS. 12-13, the fin material layer 120 may be etched using the plurality of fin patterns 151 and the plurality of dummy fin patterns 152 as a mask, to form the fins 121 and the dummy fins 122.

The plurality of fin patterns 151 and the plurality of dummy fin patterns 152 may serve as an etching mask in a subsequent process. The fin patterns 151 may be used to define the size and positions of the fins formed on the active region 111. The dummy fin patterns 152 may be used to define the size and positions of the dummy fins formed on the blank region 112.

Referring to FIG. 12, the spacing 'L2' between the fin pattern 151 and the adjacent dummy fin pattern 152 may be referred to a width of a gap between the fin pattern 151 closet to the blank region 112 and the dummy fin pattern 152 closet to the active region 111 along a direction perpendicular to a length direction of the fin pattern 151 in the plane parallel to the surface of the substrate 110. The spacing 'L1' between the adjacent fin patterns 151 may be referred to a width of a gap between the adjacent fin patterns 151 along the direction perpendicular to the length direction of the fin pattern 151 in the plane parallel to the surface of the substrate 110.

The spacing 'L2' between the fin pattern 151 and the adjacent dummy fin pattern 152 may be greater than the spacing 'L1' between the adjacent fin patterns 151, such that the spacing between the formed adjacent fins 121 may be smaller than the spacing between the fin 121 and the adjacent dummy fin 122.

In one embodiment, the fin patterns 151 and the dummy fin patterns 152 may be made of silicon nitride, to improve the quality of the fin patterns 151 and the dummy fin patterns 152. In another embodiment, the fin patterns 151 and the dummy fin patterns 152 may be made of any other suitable material having a substantially high material density and adaptable to an etching mask.

In one embodiment, forming the plurality of fin patterns 151 and the plurality of dummy fin patterns 152 may include a double patterning process, to increase the quality and density of the formed fin patterns 151 and the formed dummy fin patterns 152. Thus, the quality of the fins 121 in the formed semiconductor structure and the device integration degree may be ensured.

Figure 9:
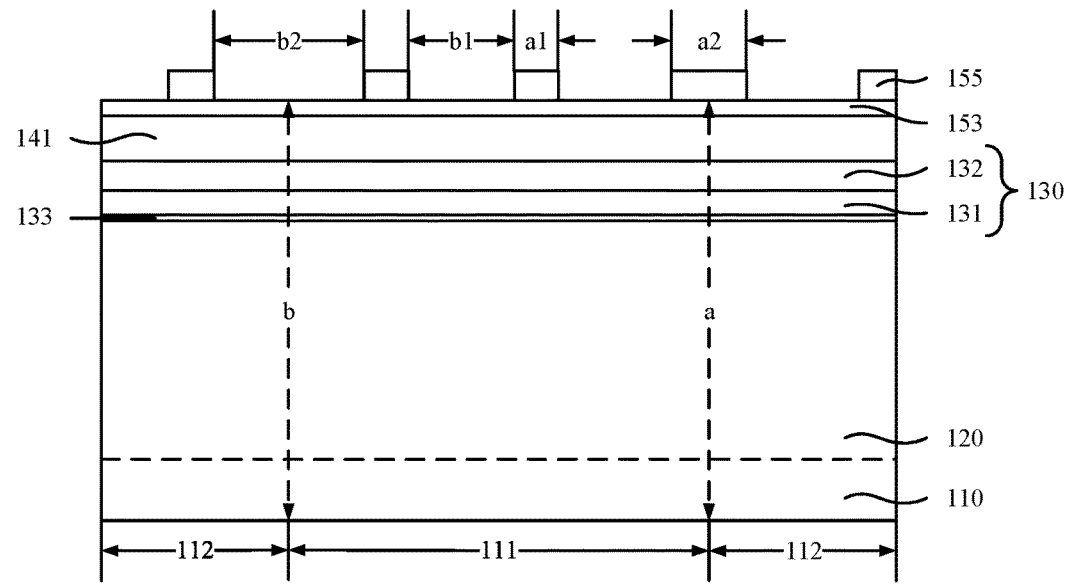

In one embodiment, forming the plurality of fin patterns 151 and the plurality of dummy fin patterns 152 may include the following. Referring to FIGS. 8-10, a plurality of core patterns 140 may be formed over the fin material layer 120. The plurality of core patterns 140 may be formed over both the active region 111 and the blank region 112. When a boundary position between the active region 111 and the blank region 112 corresponds to a position of one core pattern 140 (illustrated as a dashed line 'A' in FIG. 10), a line width 'A2' of the one core pattern 140 over the boundary position between the active region 111 and the blank region 112 may be greater than a line width 'A1' of the core pattern 140 over the active region 111. When the boundary position between the active region 111 and the blank region 112 corresponds to a position of a gap between adjacent core patterns 140 (illustrated as a dashed line 'B' in FIG. 10), a width 'B2' of the gap between the adjacent core patterns 140 over the boundary position between the active region 111 and the blank region 112 may be greater than a width 'B1' of a gap between adjacent core patterns 140 over the active region 111. Referring to FIGS. 11-12, the fin patterns 151 may be formed on sidewalls of the core patterns 140 over the active region 111, and the dummy fin patterns 152 may be formed on sidewalls of the core patterns 140 over the blank region 112. Referring to FIG. 12, the core patterns 140 (illustrated in FIG. 11) may be removed.

The plurality of core patterns 140 may be used to provide support for the formation of the plurality of fin patterns 151 and the plurality of dummy fin patterns 152. The plurality of fin patterns 151 and the plurality of dummy fin patterns 152 may be formed on the sidewalls of the plurality of core patterns 140. By removing the core patterns 140, a gap may be formed between the fin pattern 151 and the adjacent dummy fin pattern 152.

Because both the fin patterns 151 and the dummy fin patterns 152 are formed on the sidewalls of the core patterns 140, the core patterns 140 may not only provide support for the formation of the fin patterns 151 and the dummy fin patterns 152, but also define the size of the gap between the fin pattern 151 and the adjacent dummy fin pattern 152.

The boundary position between the active region 111 and the blank region 112 may correspond to the position of the one core pattern 140 (illustrated as the dashed line 'A' in FIG. 10). In other words, in the plane parallel to the surface of the substrate 110, a projection of a boundary line between the active region 111 and the blank region 112 may be within an area of a projection of the one core pattern 140. In other words, the one core pattern 140 may be across the boundary line between the active region 111 and the blank region 112. Thus, the fin pattern 151 and the adjacent dummy fin pattern 152 may be formed on the sidewalls of the core pattern 140 corresponding to the boundary position between the active region 111 and the blank region 112. Therefore, the line width 'A2' of the one core pattern 140 may be the spacing 'L2' between the fin pattern 151 and the adjacent dummy fin pattern 152. That is, along the direction perpendicular to the length direction of the fin pattern 151, a size of the core pattern 140 corresponding to the boundary position between the active region 111 and the blank region 112 may be equal to the spacing 'L2' between the fin pattern 151 and the adjacent dummy fin pattern 152.

The boundary position between the active region 111 and the blank region 112 may correspond to the gap between adjacent core patterns 140 (illustrated as the dashed line 'B' in FIG. 10). That is, in the plane parallel to the surface of the substrate 110, the projection of the boundary line between the active region 111 and the blank region 112 may be within an area of the gap between the adjacent core patterns 140. In other words, the gap between the adjacent core patterns 140 may be across the boundary line between the active region 111 and the blank region 112. Thus, the fin pattern 151 and the adjacent dummy fin pattern 152 may be formed on the sidewalls of the gap corresponding to the boundary line between the active region 111 and the blank region 112. Therefore, the width 'B2' of the gap corresponding to the boundary line between the active region 111 and the blank region 112 may be related to the spacing 'L2' between the fin pattern 151 and the adjacent dummy fin pattern 152. That is, the width 'B2' of the gap corresponding to the boundary line between the active region 111 and the blank region 112 may be equal to a sum of the spacing 'L2' between the fin pattern 151 and the adjacent dummy fin pattern 152, a width of the fin pattern 151, and a width of the dummy fin pattern 152.

When the boundary position between the active region 111 and the blank region 112 corresponds to the position of the one core pattern 140, a ratio of the line width 'A2' of the one core pattern 140 over the boundary position between the active region 111 and the blank region 112 over the line width 'A1' of the core pattern 140 over the active region 111 may be in a range of approximately 1-2. When the boundary position between the active region 111 and the blank region 112 corresponds to the position of the gap between adjacent core patterns 140, a difference between the width 'B2' of the gap between the adjacent core patterns 140 over the boundary position between the active region 111 and the blank region 112 and the width 'B1' of the gap between adjacent core patterns 140 over the active region 111 may be in a range of approximately 0 nm-35 nm. Therefore, the ratio (D2/D1) of the spacing 'D2' between the fin 121 and the adjacent dummy fin 122 over the spacing 'D1' between the adjacent fins 121 may be in a range of approximately 1-2, to meet the process and performance requirements.

In one embodiment, when the boundary position between the active region 111 and the blank region 112 corresponds to the position of the one core pattern 140, the line width 'A2' of the one core pattern 140 over the boundary position between the active region 111 and the blank region 112 may be in a range of approximately 30 nm-65 nm, and the line width 'A1' of the core pattern 140 over the active region 111 may be in a range of approximately 30 nm-45 nm. When the boundary position between the active region 111 and the blank region 112 corresponds to the position of the gap between adjacent core patterns 140, the width 'B2' of the gap between the adjacent core patterns 140 over the boundary position between the active region 111 and the blank region 112 may be in a range of approximately 50 nm-85 nm, and the width 'B1' of the gap between the adjacent core patterns 140 over the active region 111 may be in a range of approximately 50 nm-55 nm.

Because the plurality of core patterns 140 have to be subsequently removed, the core patterns 140 may be made of a material easy for removal. The process of removing the core patterns 140 may be less likely to damage the hard mask layer 130 and the fin material layer 120.

In one embodiment, the core patterns 140 may be made of amorphous silicon. In another embodiment, the core patterns 140 may be made of an organic dielectric layer (ODL) material, a dielectric anti-reflective coating (DARC) material, or a bottom anti-reflective layer (BARC) material, etc.

In one embodiment, a thickness of the core pattern 140 may be in a range of approximately 80 nm-120 nm. In other words, in a direction perpendicular to the surface of the substrate 110, a size of the core pattern 140 may be in a range of approximately 80 nm-120 nm.

Because the fin patterns 151 and the dummy fin patterns 152 are formed on the sidewalls of the core patterns 140, the thickness of the core pattern 140 cannot be too small or too large. When the thickness of the core pattern 140 is too small, the heights of the formed fin pattern 151 and the formed dummy fin pattern 152 may be too small, such that the formation quality of the fins and dummy fins may be affected. When the thickness of the core pattern 140 is too large, materials may be wasted, and the process difficulty may increase, which may cause unnecessary process risks.

In one embodiment, forming the plurality of core patterns 140 may include the following. Referring to FIGS. 8-9, a core material layer 141 may be formed over the fin material layer 120 and a plurality of photolithography patterns 155 may be formed on the core material layer 141. Referring to FIG. 10, the core material layer 141 may be patterned using the plurality of photolithography patterns 155 as a mask to form the plurality of core patterns 140.

The core material layer 141 may be used to form the plurality of core patterns 140. In one embodiment, the core patterns 140 may be made of amorphous silicon, and, thus, the core material layer 141 may be an amorphous silicon layer.

The plurality of photolithography patterns 155 may be used to pattern the core material layer 141 to define the size and positions of the core patterns 140. The photolithography patterns 155 may be made of a photoresist. Therefore, forming the photolithography patterns 155 may include forming a photoresist layer 154 over the core material layer 141 through a spin coating process, and patterning the photoresist layer 154 through exposure and development processes to form the photolithography patterns 155.

In one embodiment, after forming the core material layer 141 and before forming the plurality of photolithography patterns 155, a first anti-reflective layer 153 may be formed on the core material layer 141. The disposition of the first anti-reflective layer 153 may effectively prevent the reflection of the exposure light during the exposure and development processes and prevent the reflected light and the incident light from interfering with each other, such that the uniformity of the exposure process may be effectively improved. In one embodiment, the first anti-reflective layer 153 may be a silicon-based anti-reflective layer. In another embodiment, the first anti-reflective layer 153 may be an anti-reflective layer made of other materials.

The photolithography patterns 155 may define the size and positions of the core patterns 140. Correspondingly, when the boundary position between the active region 111 and the blank region 112 corresponds to a position of one photolithography pattern 155 (illustrated as a dashed line 'a' in FIG. 9), a line width 'a2' of the photolithography pattern 155 over the boundary position between the active region 111 and the blank region 112 may be greater than a line width 'a1' of the photolithography pattern 155 over the active region 111. When the boundary position between the active region 111 and the blank region 112 corresponds to a position of a gap between adjacent photolithography patterns 155 (illustrated as a dashed line 'b' in FIG. 9), a width 'b2' of the gap between the adjacent photolithography patterns 155 over the boundary position between the active region 111 and the blank region 112 may be greater than a width 'b1' of a gap between adjacent photolithography patterns 155 over the active region 111.

In one embodiment, after forming the photolithography patterns 155, the core material layer 141 may be etched using the photolithography patterns 155 as a mask to form the core patterns 140.

In one embodiment, the photolithography patterns 155 and the first anti-reflective layer 153 may be used up during the process of forming the core patterns 140. In another embodiment, after forming the core patterns, the photolithography patterns and the first anti-reflective layer may be partially retained. Therefore, after forming the core patterns, the remaining photolithography patterns and the first anti-reflective layer may be removed. For example, removing the remaining photolithography patterns and the first anti-reflective layer may include an ashing process, or a wet strip process, etc.

Referring to FIGS. 11-12, after forming the core patterns 140, a patterned material layer 154 may be formed over the substrate 110 and on the core patterns 140. The patterned material layer 154 may conformally cover the core patterns 140 and a surface of the hard mask layer 130. In other words, the patterned material layer 154 may be formed on the top and sidewall surfaces of core patterns 140 and on the hard mask layer 130 exposed by the core patterns 140. The patterned material layer 154 on the tops of core patterns 140 and on the hard mask layer 130 may be removed, and the remaining patterned material layer 154 on the sidewalls of the core patterns 140 may be used to form the fin patterns 151 and the dummy fin patterns 152.

After forming the fin patterns 151 and the dummy fin patterns 152, referring to FIGS. 11-12, the core patterns 140 may be removed, such that the fin patterns 151 and the dummy fin patterns 152 may be spaced apart from each other.

As shown in FIG. 13, after forming the fin patterns 151 and the dummy fin patterns 152, the fin material layer 120 may be etched using the fin patterns 151 and the dummy fin patterns 152 as a mask to form the fins 121 and the dummy fins 122 protruding on the substrate 110. The process of etching the fin material layer 120 may be used to form the fins 121 and the dummy fins 122.

The spacing 'D2' between the fin 121 and the adjacent dummy fin 122 may be greater than the spacing 'D1' between the adjacent fins 121, which may effectively reduce the requirements of overlay accuracy during subsequent removal of the dummy fins 122, facilitate to expand the process window, to reduce the process difficulty, and to improve the manufacturing yield. In addition, due to the etch loading effect, the width 'W2' of the fin 121 closest to the blank region 112 may be greater than the width 'W1' of the remaining fin 121. Therefore, an issue of reduced widths of the fins 121 caused by oxidation during a subsequent formation of an isolation layer may be counteracted to a certain extent, and the width uniformity of the fins 121 after forming the isolation layer may be effectively improved.

In one embodiment, the hard mask layer 130 including the nitride hard mask 131 and the oxide hard mask 132 may be formed on the fin material layer 120. Thus, forming the fins 121 and the dummy fins 122 may include successively etching the hard mask layer 130 and the fin material layer 120 using the plurality of fin patterns 151 and the plurality of dummy fin patterns 152 as a mask to form the fins 121 and the dummy fins 122.

Compared with the method of directly etching the fin material layer 120, the method of first etching the hard mask layer 130 using the plurality of fin patterns 151 (illustrated in FIG. 12) and the plurality of dummy fin patterns 152 (illustrated in FIG. 12) as a mask may enable the hard mask layer 130 to first form a pattern closer to the original design. Therefore, the etching accuracy of the fin material layer 120 may be effectively improved and the size and positions of the fins 121 and the dummy fins 122 may be closer to the original design, which may facilitate reduction of an etching error and increase of the process accuracy, to improve the graphic quality of the fins 121 and the dummy fins 122.

The hard mask layer 130 may include the nitride hard mask 131 and the oxide hard mask 132. Because the nitride hard mask 131 has a substantially high material density, referring to FIG. 13, after forming the fins 121 and the dummy fins 122, at least a portion of the nitride hard mask 131 may be retained on the fins 121 and the dummy fins 122. The portion of the nitride hard mask 131 retained on the fins 121 may protect the fins 121 in subsequent processes. Particularly, the probability of the fins 121 being damaged may be reduced at least during a subsequent process of removing the dummy fins 122, which may facilitate to improve the quality of the fins 121 in the formed semiconductor structure and to improve the manufacturing yield and device performance.

Figure 14:
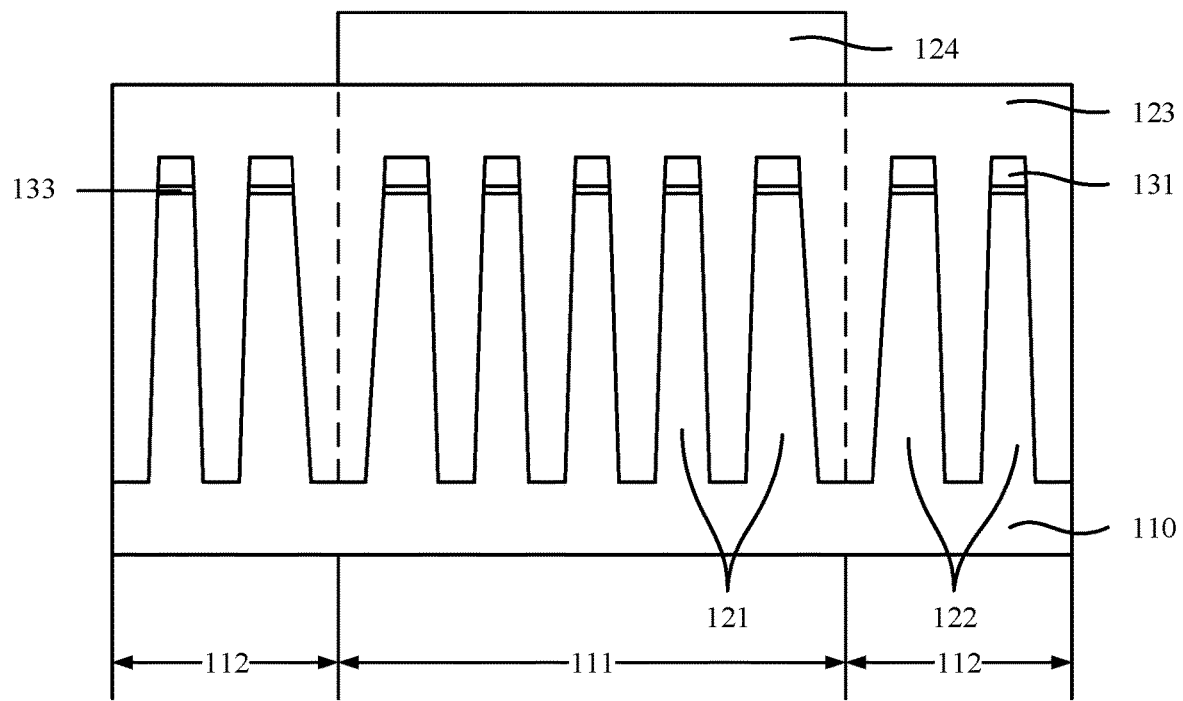
Figure 15:
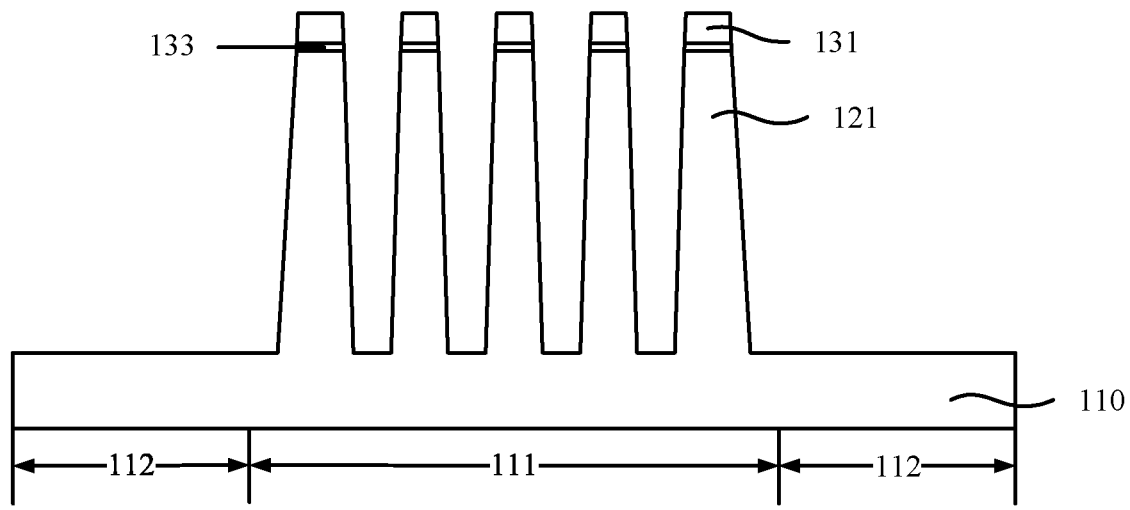

Returning to FIG. 18, after forming the fins and the dummy fins, the dummy fins may be removed (S103). FIGS. 14-15 illustrate corresponding semiconductor structures.

Referring to FIGS. 14-15, after forming the fins 121 and the dummy fins 122, the dummy fins 122 (illustrated in FIG. 14) may be removed to expose the blank region 112 of the substrate 110.

Because the semiconductor structure formed from the blank region 112 may not have fin, the process of removing the dummy fins 122 may be used to expose the blank region 122 of the substrate 110 to provide a desired operation surface for subsequent processes.

In one embodiment, removing the dummy fins may include the following. A filling layer 123 (illustrated in FIG. 14) may be formed on the substrate 110 exposed by the fins 121 and the dummy fins 122. A protection layer 124 (illustrated in FIG. 14) may be formed on a surface of the filling layer 123 above the active region 111. Referring to FIG. 15, the dummy fins 122 may be removed by etching using the protection layer 124 as a mask (illustrated in FIG. 14) to expose the blank region 112 of the substrate 110.

The filling layer 123 may sufficiently fill the gaps between the adjacent fins 121, between the fin 121 and the adjacent dummy fin 122, and between the adjacent dummy fins 122. A top of the filling layer 123 may be above the tops of the fins 121 and the dummy fins 122. In one embodiment, the remaining nitride hard mask 131 may be retained on the fins 121 and the dummy fins 122, thus, the filling layer 123 may cover the remaining nitride hard mask 131.

In one embodiment, the filling layer 123 may be an organic dielectric layer (ODL). Forming the filling layer 123 may include a spin coating process, which may improve the filling ability of the filling layer 123, reduce the formation of voids, and provide a flat process surface.

The protection layer 124 may be used to define the position and size of a region where the dummy fins 122 are removed, and may protect the fins 121. In one embodiment, the protection layer 124 may be a photoresist layer. Forming the protection layer 124 may include a spin coating process, and exposure and development processes.

To improve the accuracy of the formed protection layer 124 and to ensure the process quality of the removal of the dummy fins 122, in one embodiment, after forming the filling layer 123 and before forming the protection layer 124, a second anti-reflective layer (not illustrated) may be formed on the filling layer 123. The formation of the second anti-reflective layer may improve the exposure quality of the protection layer 124, and improve the formation accuracy of the protection layer 124.

Because the second spacing 'L2' (illustrated in FIG. 12) is greater than the first spacing 'L1' (illustrated in FIG. 12), the spacing between the fin 121 and the adjacent dummy fin 122 may be substantially large. Thus, the exposure process for forming the protection layer 124 may have substantially low process requirements of the overlay accuracy, and may have a substantially large process window. Therefore, the manufacturing yield and device performance may be effectively improved.

After forming the protection layer 124, the blank region 112 of the substrate 110 may be exposed by removing the second anti-reflective layer, the filling layer 123, and the dummy fins 122 exposed by the protection layer 124 using a dry etching process.

In one embodiment, after removing the dummy fins 122, a dielectric layer 161 (illustrated in FIG. 16) may be formed on the substrate 110 exposed by the fins 121, and referring to FIG. 17, a thickness portion of the dielectric layer 161 may be removed to partially expose the sidewalls of the fins 121.

Returning to FIG. 18, after removing the dummy fins, a dielectric layer may be formed (S104). FIG. 16 illustrates a corresponding semiconductor structure.

Referring to FIG. 16, after removing the dummy fins, a dielectric layer 161 may be formed on the substrate 110 exposed by the fins 121. The dielectric layer 161 may be used to form an isolation layer to electrically isolate the adjacent fins 121 and adjacent semiconductor structures.

In one embodiment, the dielectric layer 161 may be made of silicon oxide. To increase the filling performance of the dielectric layer 161 and to reduce the formation of voids, in one embodiment, forming the dielectric layer 161 may include a fluid chemical vapor deposition process. For example, forming the dielectric layer may include forming a flowable precursor material on the substrate 110 exposed by the fins 121; and curing the precursor material by performing an annealing treatment 162, where the cured precursor material may be used to form the dielectric layer 161.

The precursor material may be flowable, such that the precursor material may flow in a fluid or a semi-fluid state to various structures that have to be filled, and may fill the structures from bottom to up to sufficiently fill the structures. Therefore, the dielectric layer 161 formed by curing the precursor material may sufficiently fill the gaps between adjacent fins 121, and, thus, the probability of forming voids may be substantially small.

In one embodiment, the precursor material may include trisilylamine (TSA). In another embodiment, the precursor material may include any other suitable fluid or semi-fluid material, such as polysilane materials including polydisilane and cyclopentasilane. In one embodiment, forming the precursor material may include a spin coating process.

The annealing treatment 162 may be used to increase a material density of the precursor material and cure the precursor material to form the dielectric layer 161. In one embodiment, during the annealing treatment 162, N and O in the precursor material may be released due to reaction. The O in the precursor material may diffuse into the fin 121 to oxidize materials of a thickness portion of the fin 121 from the sidewall surface of the fin 121, such that the thickness of the fin 121 may be reduced.

Referring to FIG. 16, the fins 121 may be formed on the active region 111 of the substrate 110, and fin may not be formed on the blank region 112 of the substrate 110. After forming the precursor material, a width of the precursor material on the blank region 112 of the substrate 110 may be substantially large, and a width of the precursor material between the adjacent fins 121 on the active region 111 of the substrate 110 may be substantially small. Therefore, during the annealing treatment 162, for the plurality of fins 121 on the active region 111, in the fin 121 closest to the blank region 112, a thickness of the oxidized material in the sidewall facing toward the blank region 112 may be substantially large, and may be larger than a thickness of the oxidized material in the sidewall facing toward the active region 111. Also, the thickness of the oxidized material in the sidewall facing toward the blank region 112 of the fin 121 closest to the blank region 112 may be larger than a thickness of the oxidized material in the sidewalls of the remaining fins 121. After performing the annealing treatment 162, the difference in the thickness of the oxidized material in the sidewalls may cause the reduced thickness of the fin 121 closest to the blank region 112 to be substantially large and to be larger than the reduced thickness of the remaining fins 121.

However, because the fin 121 closest to the blank region 112 has a greater width, the excessive oxidized thickness of the fin 121 closest to the blank region 112 during the annealing treatment 162 may be counteracted. Therefore, after performing the annealing treatment 162, a remaining thickness of the fin 121 closest to the blank region 112 may be close to a remaining thickness of the remaining fins 121. Thus, after performing the annealing treatment 162, the fins 121 may have a desired thickness uniformity.

Parameters of the annealing treatment 162 may include an annealing temperature in a range of approximately 400° C.-1050° C., and an annealing time in a range of approximately 30 minutes-300 minutes. The annealing temperature of the annealing treatment 162 cannot be too high or too low, and the annealing time cannot be too long or too short. If the annealing temperature of the annealing treatment 162 is too high and the annealing time is too long, a thermal budget of the annealing treatment may increase, which may cause degradation of the electrical performance of the formed semiconductor structure and unnecessary process risks. If the annealing temperature of the annealing treatment 162 is too low and the annealing time is too short, the precursor material may not be effectively cured, and the quality of the formed dielectric layer 161 may be affected.

Returning to FIG. 18, after forming the dielectric layer, an isolation layer may be formed (S105). FIG. 17 illustrates a corresponding semiconductor structure.

Referring to FIG. 17, after forming the dielectric layer 161, a thickness portion of the dielectric layer 161 may be removed along a direction perpendicular to the surface of the substrate 110 to partially expose sidewalls of the fins 121 to provide a platform for a subsequent process. The remaining dielectric layer may be used to form an isolation layer 160.

In one embodiment, because the dielectric layer 161 is made of silicon oxide and the oxidized material of the fins 121 is silicon oxide, after removing the thickness portion of the dielectric layer 161, the exposed fins 121 may have a desired thickness uniformity, which may provide a desired platform for subsequent processes, and facilitate improving the performance of the formed semiconductor structure.

Accordingly, the present disclosure also provides a semiconductor structure. FIG. 13 illustrates a cross-sectional view of the semiconductor structure. Referring to FIG. 13, the semiconductor structure may include a substrate 110. The substrate 110 may include an active region 111 and a blank region 112 disposed adjacent to the active region 111. The semiconductor structure may also include a plurality of fins 121 on the active region 111 of the substrate 110, and a plurality of dummy fins 122 on the blank region 112 of the substrate 110. A spacing 'D2' between a fin 121 and an adjacent dummy fin 122 may be greater than a spacing 'D1' between adjacent fins 121.

The spacing 'D2' between the fin 121 and the adjacent dummy fin 122 may be referred to a width of a gap between the fin 121 closet to the blank region 112 and the dummy fin 122 closet to the active region 111 along a direction perpendicular to a length direction of the fin 121 in a plane parallel to a surface of the substrate 110. The spacing 'D1' between the adjacent fins 121 may be referred to a width of a gap between the adjacent fins 121 along the direction perpendicular to the length direction of the fin 121 in the plane parallel to the surface of the substrate 110.

The substantially large spacing 'D2' between the fin 121 and the adjacent dummy fin 122 may effectively reduce the requirements of overlay accuracy during subsequent removal of the dummy fins 122, which may facilitate to expand the process window, to reduce the process difficulty, and to improve the manufacturing yield.

In addition, due to an etch loading effect, the substantially large spacing 'D2' between the fin 121 and the adjacent dummy fin 122 may enable a width 'W2' of the fin 121 closest to the blank region 112 to be greater than a width 'W1' of remaining fins 121. Therefore, an issue of reduced widths of the fins 121 caused by oxidation during a subsequent formation of an isolation layer may be counteracted to a certain extent, and the width uniformity of the fins 121 after forming the isolation layer may be effectively improved. In the disclosed embodiments, the process window may be expanded, and the uniformity of fins may be improved.

The substrate 110 may provide a process operation platform for subsequent processes and may provide mechanical support in the semiconductor structure. The active region 111 of the substrate 110 may be used to form a semiconductor structure having fins, and the blank region 112 of the substrate 110 may be used to form a planar semiconductor structure. In other words, the semiconductor structure formed from the blank region 112 may not have fin(s).

In one embodiment, the number of the blank regions 112 may be two, and the two blank regions 112 may be disposed on sides of the active region 111, respectively. In another embodiment, the substrate may include one blank region disposed adjacent to the active region. In certain embodiments, the substrate may include a plurality of active regions and a plurality of blank regions. The active regions and the blank regions may be alternatively arranged.

In one embodiment, the substrate 110 may be made of monocrystalline silicon. In another embodiment, the substrate may be made of polysilicon, amorphous silicon, amorphous germanium, germanium, silicon germanium, silicon carbide, gallium arsenide, or indium gallium, etc. In certain embodiments, the substrate may be a silicon on insulator (SOI) substrate, a germanium on insulator (GOI) substrate, a glass substrate, and other types of substrates. The substrate may be made of materials adaptable to process requirements and easy for integration.

The fin 121 may be used to provide a channel for the formed semiconductor structure, and the dummy fin 122 may have to be subsequently removed to form a semiconductor structure without fin.

In one embodiment, the fins 121 and the dummy fins 122 may be made of a same material as the substrate 110. The fins 121, the dummy fins 122, and the substrate 110 may be made of monocrystalline silicon. In another embodiment, the fins and the dummy fins may be made of a material different from the substrate. The fins and the dummy fins may be made of amorphous germanium, germanium, silicon germanium, silicon carbide, gallium arsenide, or indium gallium, etc.

In one embodiment, the fins 121 and the dummy fins 122 may be an integral structure with the substrate 110. In other words, there may be no clear boundary between the substrate 110 and the fins 121 and the dummy fins 122. In another embodiment, the fins and the dummy fins may have a clear boundary with the substrate.

The spacing 'D2' (illustrated in FIG. 13) between the fin 121 and the adjacent dummy fin 122 may be greater than the spacing 'D1' (illustrated in FIG. 13) between the adjacent fins 121, which may effectively reduce the requirements of overlay accuracy during subsequent removal of the dummy fins 122, facilitate to expand the process window, to reduce the process difficulty, and to improve the manufacturing yield. In addition, the width 'W2' of the fin 121 closest to the blank region 112 may be greater than the width 'W1' of the remaining fins 121. Therefore, an issue of reduced widths of the fins 121 caused by oxidation during a subsequent formation of an isolation layer may be counteracted to a certain extent, and the width uniformity of the fins 121 after forming the isolation layer may be effectively improved.

In one embodiment, a ratio (D2/D1) of the spacing 'D2' between the fin 121 and the adjacent dummy fin 122 over the spacing 'D1' between the adjacent fins 121 may be in a range of approximately 1-2.

The ratio (D2/D1) of the spacing 'D2' between the fin 121 and the adjacent dummy fin 122 over the spacing 'D1' between the adjacent fins 121 cannot be too large or too small. When the ratio (D2/D1) of the spacing 'D2' between the fin 121 and the adjacent dummy fin 122 over the spacing 'D1' between the adjacent fins 121 is too large, the spacing 'D2' between the fin 121 and the adjacent dummy fin 122 may be too large, and the spacing 'D1' between the adjacent fins 121 may be too small. Due to the etch loading effect, the fin 121 closest to the blank region 112 may have a too large width, which may affect the uniformity of the formed fins 121. When the ratio (D2/D1) of the spacing 'D2' between the fin 121 and the adjacent dummy fin 122 over the spacing 'D1' between the adjacent fins 121 is too small, the spacing 'D2' between the fin 121 and the adjacent dummy fin 122 may be too small, and the spacing 'D1' between the adjacent fins 121 may be too large. Thus, the requirements of the overlay accuracy may not be reduced, and the process window may not be expanded.

In one embodiment, the spacing 'D2' between the fin 121 and the adjacent dummy fin 122 may be in a range of approximately 25 nm-50 nm, and the spacing 'D1' between the adjacent fins 121 may be in a range of approximately 25 nm-30 nm. The configuration of the spacing between the fin 121 and the adjacent dummy fin 122 within a suitable range may maintain a device density of the formed semiconductor structure to ensure the integration degree of the formed semiconductor structure; may effectively expand the process window and reduce the process difficulty to ensures the manufacturing yield for forming the semiconductor structure; and may enable the width of the fin 121 closest to the blank region 112 and the width of the dummy fin 122 closest to the active region 111 to be substantially large to counteract the width loss of the fin 121 in the subsequent process, which may facilitate improving the width uniformity of the fins 121 in the formed semiconductor structure.

In one embodiment, a remaining hard mask layer may be retained on the fins 121 and the dummy fins 122 to obtain a pattern closer to an original design, and to protect the tops of the formed fins 121. For example, the remaining hard mask layer may be a remaining nitride hard mask 131.

In addition, a remaining pad oxide layer 133 may be disposed between the remaining nitride hard mask 131 and the fins 121. The pad oxide layer 133 may repair defects on the tops of the fins 121, protect the tops of the fins 121, and provide a desired surface for the nitride hard mask 131.

In the disclosed embodiments, the spacing between the fin and the adjacent dummy fin may be greater than the spacing between the adjacent fins. The substantially large spacing between the fin and the adjacent dummy fin may effectively reduce the requirements of overlay accuracy during subsequent removal of the dummy fins, facilitate to expand the process window, to reduce the process difficulty, and to improve the manufacturing yield. In addition, due to the etch loading effect, the substantially large spacing between the fin and the adjacent dummy fin may enable the width of the fin closest to the blank region to be greater than the width of the remaining fins. Therefore, an issue of reduced widths of the fins caused by oxidation during the subsequent formation of the isolation layer may be counteracted to a certain extent, and the width uniformity of the fins after forming the isolation layer may be effectively improved. In the disclosed embodiments, the process window may be expanded, and the uniformity of fins may be improved.

Before forming the fins and the dummy fins, the hard mask layer may be formed on the fin material layer. Forming the fins and the dummy fins may include successively etching the hard mask layer and the fin material layer. Compared with the method of directly etching the fin material layer, the method of first etching the hard mask layer using the plurality of fin patterns and the plurality of dummy fin patterns as a mask may enable the hard mask layer to first form a pattern closer to the original design. Therefore, the etching accuracy of the fin material layer may be effectively improved, and the size and positions of the fins and the dummy fins may be closer to the original design, which may facilitate reduction of the etching error and increase of the process accuracy, to improve the graphic quality of the fins and the dummy fins.

The hard mask layer may have a stacked-layer structure, including the nitride hard mask and the oxide hard mask on the nitride hard mask. After forming the fins and the dummy fins, at least a portion of the nitride hard mask may be retained on the fins and the dummy fins. The portion of the nitride hard mask retained on the fins may protect the fins in subsequent processes. Particularly, the probability of the fins being damaged may be reduced at least during removal of the dummy fins, which may facilitate to improve the quality of the fins in the formed semiconductor structure and to improve the manufacturing yield and device performance.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
   providing a substrate, wherein the substrate includes an active region and a blank region disposed adjacent to the active region;
   forming a fin material layer on the substrate and a hard mask material layer on the fin material layer; and
   sequentially forming a hard mask on the fin material layer and forming a plurality of fins on the active region, and a plurality of dummy fins on the blank region by etching the hard mask material layer and the fin material layer using a plurality of fin patterns over the active region, and a plurality of dummy fin patterns over the blank region as a same mask, wherein a spacing between a fin and an adjacent dummy fin is greater than a spacing between adjacent fins, wherein:
 a spacing between a fin pattern and an adjacent dummy fin pattern is greater than a spacing between adjacent fin patterns,
 forming the plurality of fin patterns and the plurality of dummy fin patterns includes: a double patterning process, and
 forming the plurality of fin patterns and the plurality of dummy fin patterns includes:
 forming a plurality of core patterns over the fin material layer,
 wherein:
  the plurality of core patterns are disposed on both the active region and the blank region,
  when a boundary position between the active region and the blank region corresponds to a position of one core pattern, a line width of the one core pattern over the boundary position between the active region and the blank region is greater than a line width of a core pattern over the active region, and
  when the boundary position between the active region and the blank region corresponds to a position of a gap between adjacent core patterns, a width of the gap between the adjacent core patterns over the boundary position between the active region and the blank region is greater than a width of a gap between adjacent core patterns over the active region;
 forming the plurality of fin patterns on sidewalls of the core patterns over the active region, and the plurality of dummy fin patterns on sidewalls of the core patterns over the blank region; and
 removing the plurality of core patterns.

2. The method according to claim 1, wherein forming the plurality of core patterns includes:
 forming a core material layer over the fin material layer, and a plurality of photolithography patterns on the core material layer; and
 patterning the core material layer using the plurality of photolithography patterns as a mask to form the plurality of core patterns.

3. The method according to claim 2, after forming the core material layer and before forming the plurality of photolithography patterns, further including:
 forming a first anti-reflective layer on the core material layer.

4. The method according to claim 1, wherein:
 a ratio of the spacing between the fin and the adjacent dummy fin over the spacing between the adjacent fins is in a range of approximately 1-2.

5. The method according to claim 1, wherein:
 the spacing between the fin and the adjacent dummy fin is in a range of approximately 25 nm-50 nm.

6. The method according to claim 1, wherein:
 the spacing between the adjacent fins is in a range of approximately 25 nm-30 nm.

7. A method for fabricating a semiconductor structure, comprising:
 providing a substrate, wherein the substrate includes an active region and a blank region disposed adjacent to the active region;
 forming a fin material layer on the substrate; and
 forming a plurality of fins on the active region, and a plurality of dummy fins on the blank region by etching the fin material layer, wherein a spacing between a fin and an adjacent dummy fin is greater than a spacing between adjacent fins, wherein forming the plurality of fins and the plurality of dummy fins includes:
 forming a plurality of fin patterns over the active region, and a plurality of dummy fin patterns over the blank region, wherein a spacing between a fin pattern and an adjacent dummy fin pattern is greater than a spacing between adjacent fin patterns;
 etching the fin material layer using the plurality of fin patterns and the plurality of dummy fin patterns as a mask to form the plurality of fins and the plurality of dummy fins;
 removing the plurality of dummy fins to expose the blank region of the substrate;
 forming a dielectric layer on the substrate exposed by the plurality of fins; and
 removing a thickness portion of the dielectric layer along a direction perpendicular to a surface of the substrate to partially expose sidewall surfaces of the plurality of fins.

8. The method according to claim 7, wherein removing the dummy fins includes:
 forming a filling layer on the substrate exposed by the plurality of fins and the plurality of dummy fins;
 forming a protection layer on a surface of the filling layer over the active region; and
 removing the plurality of dummy fins by etching using the protection layer as a mask to expose the blank region of the substrate.

9. The method according to claim 7, wherein forming the dielectric layer includes:
 a fluid chemical vapor deposition process.

10. The method according to claim 7, wherein forming the dielectric layer includes:
 forming a flowable precursor material on the substrate exposed by the plurality of fins; and
 curing the precursor material by performing an annealing treatment, wherein the cured precursor material forms the dielectric layer.

11. The method according to claim 10, wherein parameters of the annealing treatment include:
 an annealing temperature in a range of approximately 400° C.-1050° C.; and
 an annealing time in a range of approximately 30 minutes-300 minutes.

12. The method according to claim 7, wherein:
 a ratio of the spacing between the fin and the adjacent dummy fin over the spacing between the adjacent fins is in a range of approximately 1-2.

13. The method according to claim 7, wherein:
 the spacing between the fin and the adjacent dummy fin is in a range of approximately 25 nm-50 nm.

14. The method according to claim 7, wherein:
 the spacing between the adjacent fins is in a range of approximately 25 nm-30 nm.

15. The method according to claim 14, after forming the core material layer and before forming the plurality of photolithography patterns, further including:
 forming a first anti-reflective layer on the core material layer.

16. The method according to claim 7, wherein forming the plurality of fin patterns and the plurality of dummy fin patterns includes:
 a double patterning process.

17. The method according to claim 16, wherein forming the plurality of fin patterns and the plurality of dummy fin patterns includes:

forming a plurality of core patterns over the fin material layer, wherein:

the plurality of core patterns are disposed on both the active region and the blank region, when a boundary position between the active region and the blank region corresponds to a position of one core pattern, a line width of the one core pattern over the boundary position between the active region and the blank region is greater than a line width of a core pattern over the active region, and when the boundary position between the active region and the blank region corresponds to a position of a gap between adjacent core patterns, a width of the gap between the adjacent core patterns over the boundary position between the active region and the blank region is greater than a width of a gap between adjacent core patterns over the active region;

forming the plurality of fin patterns on sidewalls of the core patterns over the active region, and the plurality of dummy fin patterns on sidewalls of the core patterns over the blank region; and removing the plurality of core patterns.

* * * * *